United States Patent [19]

Miki et al.

[11] 4,163,943

[45] Aug. 7, 1979

[54] RADIO RECEIVER EMPLOYING PREMIXING AND DIGITAL DISPLAY

[75] Inventors: Sukeichi Miki, Ikoma; Shuichi Ninomiya, Kodoma; Shin Fukuda; Yukio Sugimoto, both of Katano, all of Japan

[73] Assignee: Matsushita Electric Industrial Co., Ltd., Osaka, Japan

[21] Appl. No.: 804,461

[22] Filed: Jun. 7, 1977

[30] Foreign Application Priority Data

Jun. 14, 1976 [JP] Japan .................................. 51/69947
Jul. 6, 1976 [JP] Japan .................................. 51/80509
Jul. 6, 1976 [JP] Japan .................................. 51/80510

[51] Int. Cl.² .......................... H04B 1/16; H04B 1/26
[52] U.S. Cl. .................................. 325/433; 324/78 D; 325/455; 331/64
[58] Field of Search ............... 325/430, 455, 432, 452, 325/433, 334, 431; 324/78 D; 331/64, 38, 39

[56] References Cited

U.S. PATENT DOCUMENTS

| | | | |
|---|---|---|---|
| 2,679,005 | 5/1954 | Bataille et al. ....................... | 325/430 |
| 3,244,983 | 4/1966 | Ertman ................. | 324/79 D |
| 3,248,652 | 4/1966 | Kruse .................. | 325/430 |
| 3,361,976 | 1/1968 | Konian ................. | 325/432 |
| 3,593,153 | 7/1971 | Maitland et al. ...... | 325/432 |
| 3,701,951 | 10/1972 | Krausser ............. | 325/455 |
| 3,753,119 | 8/1973 | Close .................. | 331/64 |
| 3,938,048 | 2/1976 | Elliott ................. | 324/78 D |
| 3,991,382 | 11/1976 | Iida ..................... | 325/455 |
| 4,065,727 | 12/1977 | Johnson, Sr. ......... | 325/455 |
| 4,114,101 | 9/1978 | Sekiguchi ............. | 325/455 |

*Primary Examiner*—Marc E. Bookbinder
*Attorney, Agent, or Firm*—Wenderoth, Lind & Ponack

[57] ABSTRACT

A short wave broadcasting receiver which can receive accurately and stably the desired station is formed with a local oscillator which comprises a variable frequency oscillator, reference frequency oscillators, premixers and band pass filters, frequency converter and an 1F amplifier. By adding a frequency counter unit comprising a frequency counter block and digital display block, the received frequency can be digitally displayed stably and correctly by using a cheap low speed frequency counter.

3 Claims, 3 Drawing Figures

RADIO RECEIVER EMPLOYING PREMIXING AND DIGITAL DISPLAY

BACKGROUND OF THE INVENTION

This invention relates to a radio receiver, and more particularly to a radio receiver which can receive a signal of a desired frequency stably and accurately with a desirable characteristic of suppressing a spurious signal, and further to a radio receiver which can display the received frequency in digits by means of a frequency counter.

Generally, in short wave broadcasting, the carrier frequency uses a very wide frequency band from 3 MHz to 30 MHz, and there are broadcasting stations numbering 4000 to 5000 in the world. The minimum unit of the carrier frequency regulation of these stations is on the order of kilohertz. Therefore, a receiver for receiving a short wave signal is required to receive the desired signal accurately and to continue the receiving stably for a long time. However, conventional short wave radio receivers are not always satisfactory for the above requirements. It is often troublesome to tune the desired station accurately, and even when the receiver is accurately tuned to the desired station there is often a problem of drift of the received frequency.

As one of the methods of improving the accuracy of tuning, there is a method of counting the oscillated frequency of a local oscillator digitally and displaying the numeral of the short wave frequency to be received. In such a short wave receiver, the received frequency should be counted and displayed accurately and stably. In the prior art, for a superheterodyne radio receiver, known to be one of the best methods of improving the display accuracy of the received frequency, the oscillated frequency of the local oscillator is directly counted and corrected with addition or subtraction of the intermediate frequency of e.g. 455 KHz, and then the received frequency is digitally displayed. However, conventionally there is a problem in this method as follows. That is, in receiving the signal of short wave band of 3 to 30 MHz, although the frequency drift of the local oscillation frequency near to the lower end of the above band is comparatively small, for a higher frequency of that band it is difficult to hold stably the desired signal, which is once tuned accurately, for a long time. Further, in the case when a digital displaying device as described above is installed in a radio receiver, it becomes necessary to count the frequency up to a higher frequency. That is, although it depends on the intermediate frequency, in the case of 455 KHz intermediate frequency, it is necessary to count the frequency up to 30.455 KHz. This fact requires a high speed integrated circuit such as TTL for a radio receiver, and it is undesirable because of power consumption thereof and of heat generation in the set and spurious radiation.

For the problem described above, there is a method using a variable frequency oscillator having an oscillation frequency enough lower than the upper limit, e.g. 30 MHz, of the desired receiving frequencies and a reference frequency oscillator such as a crystal oscillator having a stable reference oscillation frequency. The output signals of these two oscillators are mixed and passed through a band pass filter, and then there is provided a desired higher local oscillation frequency which is the sum or difference of these two oscillation frequencies. However, in this method it is very difficult to take out only the desired local oscillation frequency because of difficulty of eliminating all of the spurious signals, i.e. higher harmonics of the two oscillation frequencies and cross modulation signals thereof, at the same time. In addition, there are further disadvantages that such a method requires many band pass filters and that in case of displaying the received frequency by means of a digital counter a high speed presettable frequency counter, which is usually expensive, is required, as described hereinbefore.

SUMMARY OF THE INVENTION

An object of the present invention is to provide an improved and novel radio receiver in which the problems described above can be eliminated and in which tuning is accurate and stable with less disturbance from spurious signals.

Another object of the present invention is to provide a novel and improved multi-band radio receiver with a simple circuit configuration in which tuning is accurate and stable and eliminates a spurious signals.

A further object of the present invention is to provide a radio receiver which can display the received frequency by means of a frequency counter of a comparatively low speed. A further object of the present invention is to provide a radio receiver which can correct the error of indication in displaying the received frequency by means of a simple circuit.

These objects can be achieved according to the present invention by providing a radio receiver which comprises an input terminal to which a received signal of a frequency $f_0$ is applied, a local oscillator for providing an output signal of a frequency $f_1$, a frequency converter connected to said input terminal and an output terminal of said local oscillator, said frequency converter mixing said received signal and said output signal of said local oscillator and providing out a signal of an intermediate frequency $f_2$, which is the algebraic sum of said received frequency $f_0$ and said local oscillation frequency $f_1$, i.e. $f_2 = f_0 \pm f_1$, and an intermediate frequency amplifier connected to said frequency converter and amplifying said signal of said intermediate frequency $f_2$; said local oscillator comprising a variable frequency oscillator having an oscillation frequency $f_v$, a first reference frequency oscillator having an oscillation frequency $f_{R1}$ which is higher than the upper limit of the frequency band to be received, a first premixer connected to said variable frequency oscillator and said first reference frequency oscillator and mixing output signal of these two oscillators, a first band pass filter connected to said first premixer and passing through a frequency $f_{B1}$ which is the sum or difference of said oscillation frequencies of said variable frequency oscillator and said first reference frequency oscillator, i.e. $f_{B1} = f_{R1} \pm f_v$, a second reference frequency oscillator having an oscillation frequency of $f_{R2}$, a second premixer connected to said first band pass filter and said second reference frequency oscillator and mixing output signals of these two circuits, and a second band pass filter connected to said second premixer and having an output terminal connected to said output terminal of said first local oscillator, said second band pass filter passing through a frequency $f_{B2}$ which is the algebraic sum of said frequency $f_{B1}$ passed through said first band pass filter and said oscillation frequency $f_{R2}$ of said second reference frequency oscillator, i.e. $f_{B2} = f_{B1} \pm f_{R2}$, and providing that signal of said frequency $f_{B2}$ to said output terminal of said first local oscillator; and/or a radio receiver which comprises an input terminal to which a received signal of a frequency $f_0$ is applied, a first local oscillator for providing an output signal of a frequency $f_1$, a first frequency converter connected to said input terminal and on output terminal of said first local oscillator, said first frequency converter mixing said received signal and said output signal of said first local oscillator and providing out a signal of a first intermediate frequency $f_2$, which is the algebraic sum of said received frequency $f_0$ and said first local oscillation frequency $f_1$, i.e. $f_2=f_0 \pm f_1$, a first intermediate frequency amplifier connected to said first frequency converter and amplifying said signal of said first intermediate frequency $f_2$, and a frequency counter unit for digital displaying said received frequency $f_0$; said first local oscillator contains a variable frequency oscillator having an oscillation frequency $f_{v1}$ corresponding to said received frequency $f_0$ and having lower figure which coincides with that of said received frequency $f_0$; and said frequency counter unit comprising a buffer amplifier connected to said variable frequency oscillator and amplifying an output signal of said variable frequency oscillator, a gate circuit connected to said buffer amplifier and passing through an output signal of said buffer amplifier for a certain period, a lower digit frequency counter connected to said gate circuit, said lower digit frequency counter counting a frequency of an output signal of said gate circuit, that is the lower figure of said frequency $f_{v1}$ of said variable frequency oscillator, and providing out a counted digital information in an output signal thereof, an upper digit frequency counter which is a presettable counter and connected to said lower digit frequency counter, a presetter connected to said upper digit frequency counter, said presetter generating a digital code information of upper figure of said oscillation frequency $f_{v1}$ of said variable frequency oscillator, which is a difference of said received frequency $f_o$ and said oscillation frequency $f_{v1}$, and providing said digital code information as a preset value to said upper digit frequency counter, said upper digit frequency counter counting the upper figure of said oscillation frequency $f_{v1}$ of said variable frequency oscillator, adding said preset value provided by said presetter to a counted value and providing out a digital information of addition of said upper figure and said preset value in an output signal thereof, and a digital display block connected to said lower and upper digit frequency counters and displaying said digital informations of said outputs of these two counters.

BRIEF DESCRIPTION OF THE DRAWINGS

These and other objects and the features of the present invention will be apparent from consideration of the following detail description of an embodiment of the invention with accompanying drawings, in which.

DETAILED DESCRIPTION OF THE PREFERRED EMBODIMENT

Figure 1:
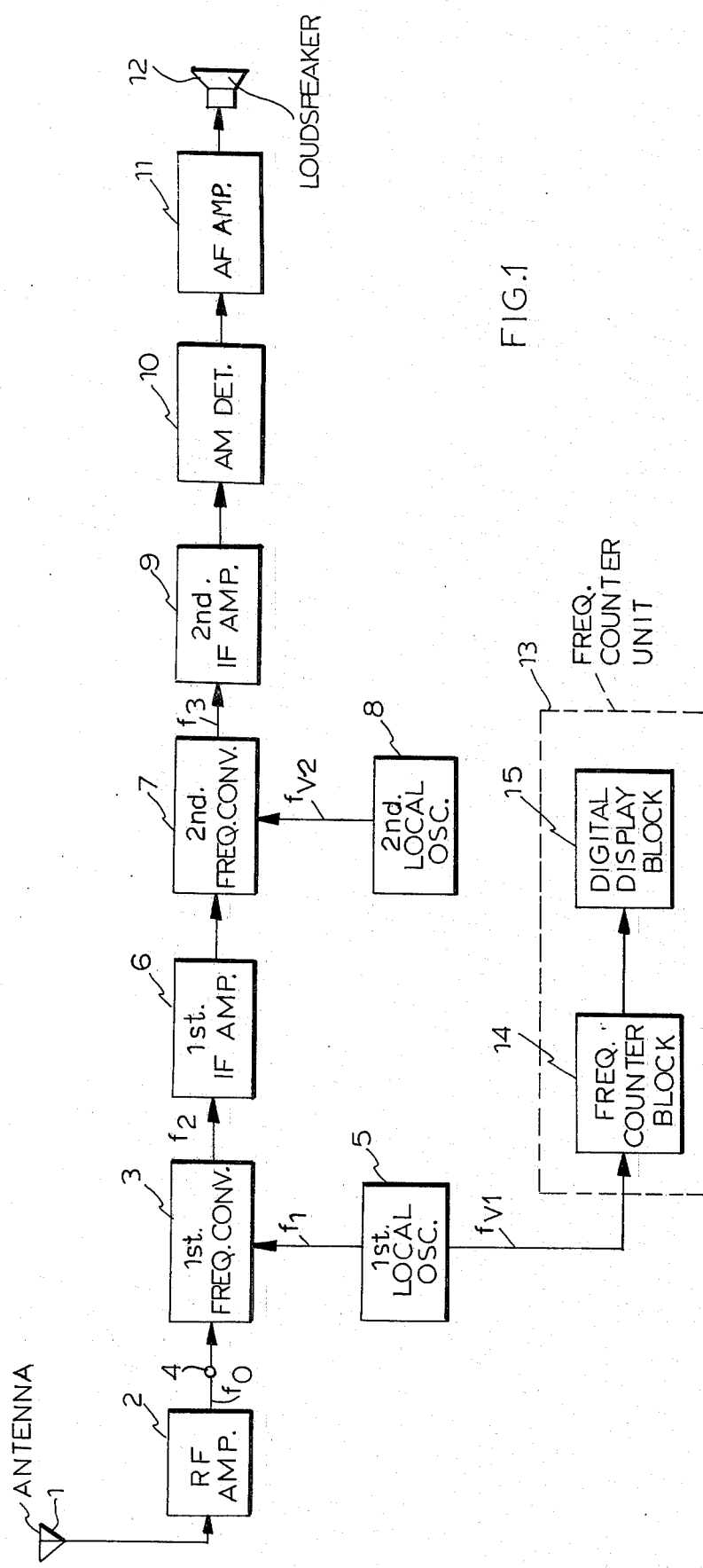
FIG. 1 is a block diagram of an embodiment of a radio receiver according to the present invention.

FIG. 1 shows an embodiment of the present invention, a double-super hetrodyne type short wave receiver which can display the received frequency in digit by means of a frequency counter. In FIG. 1, a signal received by an antenna designated by a reference numeral 1 is applied to a radio frequency amplifier (RF Amp) 2. Said RF Amp 2 has a selection circuit for selecting the received signal of frequency $f_0$, and the selected received signal of that frequency $f_0$ is applied to an input terminal 4 of a first frequency converter (1st Freq. Conv.) 3. Said 1st Freq. Conv. 3 has another input terminal connected to an output terminal of a first local oscillator (1st Local Osc.) 5. The received signal of the frequency $f_0$ and the input signal of a frequency $f_1$ of said 1st Local Osc. 5 are mixed by the 1st Freq. Conv. 3, and there is provided a signal of a first intermediate frequency (1st IF) $f_2$ of the algebraic sum of these two frequencies ($f_2=f_0 \pm f_1$).

A first intermediate frequency amplifier (1st IF Amp.) 6 connected to the 1st Freq. Conv. 3 amplifies said 1st IF signal and provides its output signal to a second frequency converter (2nd Freq. Conv.) 7. Said 2nd Freq. Conv. 7 mixes the 1st IF signal and an output signal of frequency $f_{v2}$ of a second local oscillator (2nd Local Osc.) 8, and a resultant signal of a second intermediate frequency $f_3$ ($f_3=f_2 \pm f_{v2}$) is applied to a second intermediate frequency amplifier (2nd IF Amp.) 9. Said 2nd IF Amp. 9 is connected to an amplitude modulation detector (AM Det.) 10, which is connected to an audio frequency amplifier (AF Amp.) 11 connected to a loudspeaker 12. Further, a frequency counter unit 13 composed of a frequency counter block 14 and a digital display block 15 is connected to a first variable frequency oscillator contained in the 1st Local Osc. 5. Said frequency counter unit 13 counts its oscillation frequency and digital displays the received frequency $f_0$. As these blocks shown in FIG. 1, except the 1st Local Osc. and the frequency counter unit 13, can be realized by the suitable circuits which are well known to those skilled in art, detailed description of the respective circuits are omitted herewith for simplification.

Figure 2:
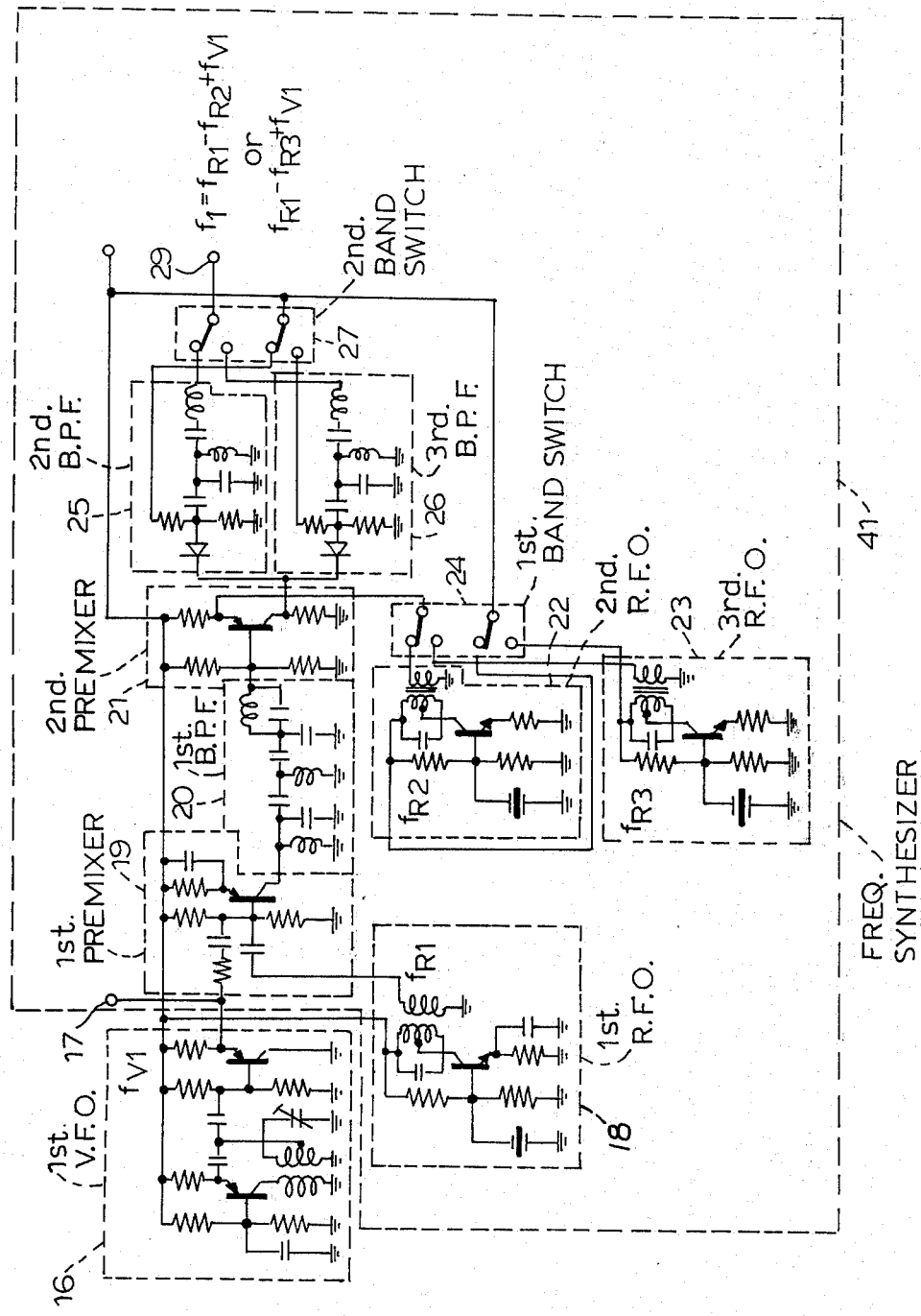
FIG. 2 is a circuit diagram of an embodiment of a first local oscillator of the invention used for the radio receiver shown in FIG. 1.

FIG. 2 shows an embodiment of the 1st Local Osc. 5 used in FIG. 1 according to the invention. In FIG. 2, an oscillation frequency $f_{v1}$ of the first variable frequency oscillator (1st V.F.O.) 16 and its variable range $\Delta f_{v1}$ are arranged to be low and small so as to ensure sufficient stability (e.g. $f_{v1}=5 \sim 9$ MHz, $\Delta f_{v1}=4$ MHz). As a first reference frequency oscillator (1st R.F.O) 18, a fixed oscillator of high stability such as a crystal oscillator is used, and its oscillation frequency $f_{R1}$ is arranged to be a frequency higher than the upper limit of the receiving frequency band (e.g. $f_{R1}=60$ MHz). The output signals of the frequencies $f_{v1}$ and $f_{R1}$ of these two oscillators are applied to a first premixer 19 and mixed thereby. A first band pass filter (1st B.P.F) 20 connected to the output terminal of said first premixer 19 passes through only a frequency component of $f_{R1}+f_{v1}$ (e.g. 65 to 69 MHz) and provides a signal of that frequency to a second premixer 21.

A second reference frequency oscillator (2nd R.F.O.) 22 and a third reference frequency oscillator (3rd R.F.O.) 23 are stable fixed oscillators having oscillation frequencies $f_{R2}$ and $f_{R3}$, respectively (e.g. $f_{R2}=40$ MHz, $f_{R3}=48$ MHz). Any one of the output signals of these 2nd R.F.O. 22 and 3rd R.F.O. 23 is selected by a first band switch 24 and provided to the second premixer 21. When the 2nd R.F.O. is selected by the first band switch 24, in the second premixer 21 there is provided a frequency component $f_1$ of a difference of the output signal frequency $f_{R1}+f_{v1}$ of the 1st B.P.F. 20 and the oscillation frequency $f_{R2}$ of the 2nd R.F.O. 22, i.e. $f_1=f_{R1}-f_{R2}+f_{v1}$. A second band pass filter (2nd B.P.F.) 25 passes through only that frequency component $f_1=f_{R1}-f_{R2}+f_{v1}$ (e.g. $f_1=25$ to 29 MHz) and provides the output signal of the frequency. This output signal is selected by a second band switch 27 and provided to an output terminal 29. Said output terminal 29 is the output terminal of the 1st Local Osc. 5 described hereinbefore and connected to the 1st Freq. Conv. 3. When the center frequency of the 1st IF Amp. 6 is 2 MHz, in the case of the above example of the frequencies shown in the parentheses, the signals of short wave from 27 to 31 MHz can be satisfactorily received.

There is conventionally a so-called premix method used for amateur band receiver, in which one variable frequency oscillator and one reference frequency oscillator are used and a frequency of the algebraic sum of both the oscillation frequencies of them is generated as a local oscillation frequency. That is, the resulting frequency used could be the sum frequency or the difference frequency. As the receiving band of the amateur band receiver is comparatively narrow, in this case it is easy to separate the desired local oscillation signal and undesired spurious signal. On the other hand, as the receiving band of a short wave broadcasting receiver is wide, many spurious signals owing to premixing are caused at the output terminal of the local oscillator and so it is difficult to use such a premix method for the short wave broadcasting receiver.

According to the present invention, as described hereinbefore, as the oscillation frequency of the first variable frequency oscillator is once converted to the frequency higher than the receiving band by means of the first reference frequency oscillator, and after that down-converted by means of the second reference frequency oscillator, it becomes possible to eliminate the spurious signals as described above. Further, according to the present invention, as the oscillation frequency $f_{v1}$ of the first variable frequency oscillator can be made low, the short wave broadcasting signal can be received very stably. In addition, by counting said frequency $f_{v1}$, the received frequency $f_0$ can be digitally displayed comparatively easily. If the frequency $f_{v1}$ is high, a high speed frequency counter of high cost is required.

Usually, a short wave broadcasting receiver receives the signal by dividing the receiving band of about 3 to 30 MHz into suitable bands. In the above mentioned example, although the broadcasting wave of 27 to 31 MHz can be received as one receiving band, for receiving the broadcasting wave lower than 27 MHz many reference frequency oscillators and band pass filters as of the 3rd R.F.O. 23 and 3rd B.P.F. 26 are necessary. However, according to the present invention, by arranging the frequency variable range $\Delta f_{v1}$ of the 1st V.F.O. 16 to twice of the center frequency of the 1st IF Amp. 6, the number of the required reference frequency oscillators and band pass filters can be reduced to a half. That is, as the center frequency of the 1st IF Amp. 6 is 2 MHz in the above example, the frequency variable range $\Delta f_{v1}$ is made 4 MHz. Thus, there is provided a signal of frequency of 25 to 29 MHz at the output terminal 29 of the 1st Local Osc. 5. By this frequency, the broadcasting wave of not only the band of 27 to 31 MHz but also the band of 23 to 27 MHz can be received, because the center frequencies of these two bands are 2 MHz common to each other.

Besides, there is another problem in prior art at digital displaying the received frequency with use of a digital counter. That is, it is necessary to use a presettable counter so as to correct the difference between the received frequency and the practically counted first local oscillation frequency. The presettable counter has a more speed and is higher expensive as compared to a non-presettable counter. Further, the presettable counter to be used is required to be faster and so more expensive for a lower figure of the frequency to be counted and and digital displayed. Further, in a conventional short wave broadcasting receiver, it is necessary to correct with the intermediate frequency of 455 KHz. According to the present invention, a radio receiver which can digitally display the received frequency can be provided without using a high speed presettable counter and so with a low cost.

Figure 3:
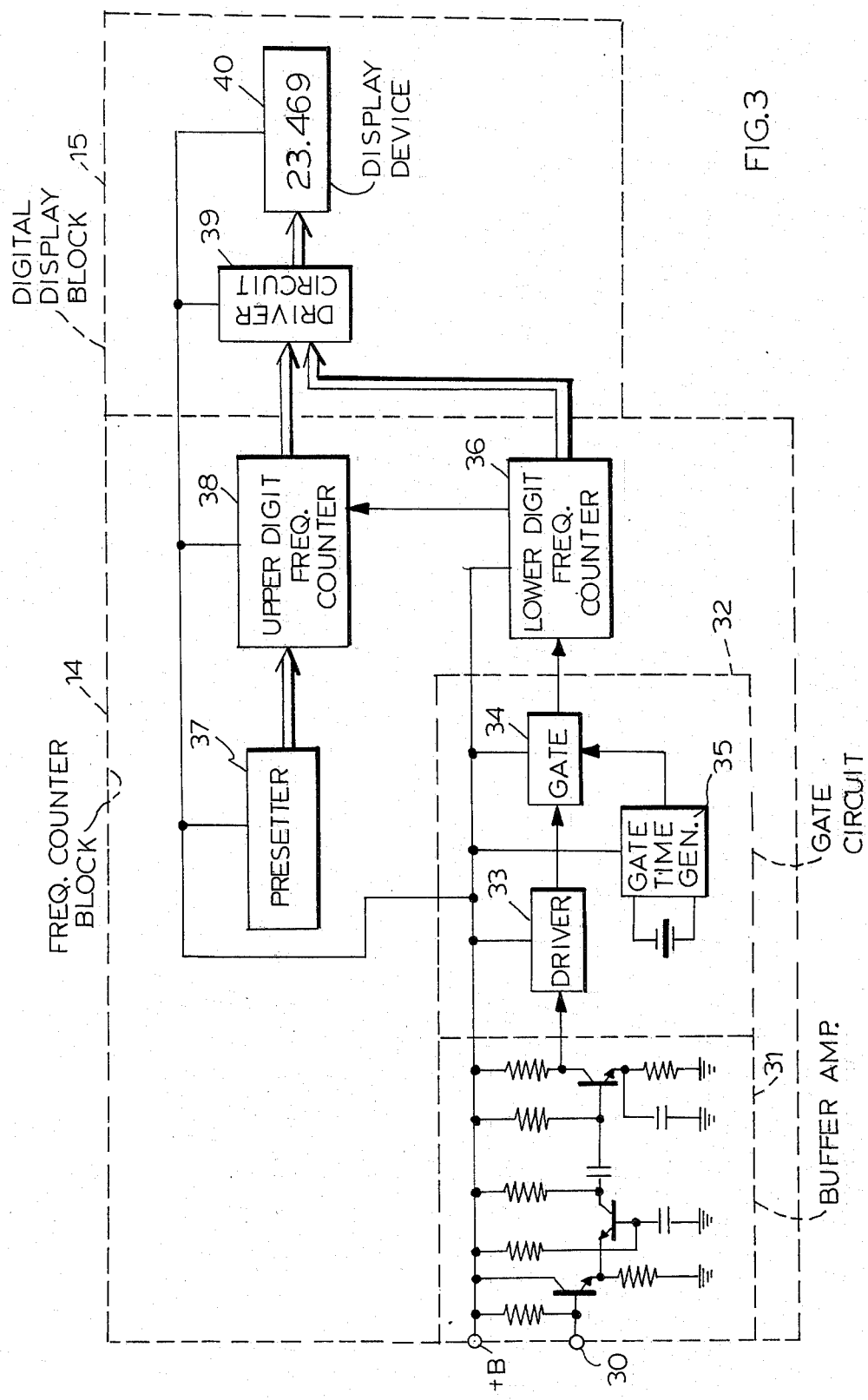
FIG. 3 is a circuit diagram, partially in blocks, of a frequency counter unit used for a radio receiver according to the invention.

FIG. 3 shows an embodiment of a frequency counter unit used for the radio receiver according to the invention. An output terminal 17 of the first variable frequency oscillator 16 shown in FIG. 2 is connected to an input terminal 30 of a buffer amplifier 31 of FIG. 3. The output signal having the oscillation frequency $f_{v1}$ of the first variable frequency oscillator 16 is amplified by said buffer amplifier 31 and provided to a gate 34 in a gate circuit 32. If necessary, a driver 33 may be inserted between the buffer amplifier 31 and the gate 34. The period of the signal passing through the gate 34 is determined by a gate time generator 35 connected to the gate 34. The frequency of the signal passed through the gate 34 is counted by a lower digit frequency counter 36 connected to the gate 34. Said lower digit frequency counter 36 is a non-presettable counter and it counts the lower figure of the frequency of $f_{v1}$ of the first variable frequency oscillator 16. An upper digit frequency counter 38 connected to a presetter 37 is a presetable counter, and a preset value thereof is decided by said presetter 37. Said upper digit frequency counter 38 is connected to the lower digit frequency counter 36, and it counts the upper figure of the frequency $f_{v1}$ of the first variable frequency oscillator 16. The digital information of the outputs of these two counters are provided to a driver circuit 39 and then digital displayed by a display device 40 formed e.g. by light emitting diodes. As the blocks shown in FIG. 3 can be realized by suitable circuits which are well known to those skilled in art, detailed description of the respective circuits are omitted herewith for simplification.

According to the present invention, the received frequency $f_0$ is digitally displayed by using the first variable frequency oscillator having a variable tuning circuit for providing the oscillation frequency $f_{v1}$ which coincides with the received frequency $f_0$ in the lower figure and by correcting for different upper figures by the presetter 37. Accordingly, it becomes possible to use the non-presettable counter 36 of low speed and low cost, as described hereinbefore, and so there is provided a short wave broadcasting receiver of low cost which can digitally display the received frequency.

Another feature of the present invention is the first local oscillator comprising a frequency synthesizer and the first variable frequency oscillator having the frequency $f_{v1}$. The frequency synthesizer is connected to the variable frequency oscillator, and it provides the output signal of the frequency of $f_R \pm f_{v1}$ by shifting the above frequency $f_{v1}$ by a certain reference frequency $f_R$. Therefore, in this case the above mentioned preset value of the presetter becomes the algebraic sum of that difference frequency $f_R$ and the center frequency $f_C$ of the 1st IF Amp. 6, i.e. $f_R \pm f_C$. Accordingly, degree of freedom for designing the frequency $f_C$ or $f_R$ becomes large. Further another feature of the present invention is that when the frequency synthesizer as described above is not used, the 1st IF Amp. uses a tuning circuit having the center frequency $f_C$, which is an integral multiple of 100 KHz. By this, it easily becomes possible to use a non-presettable counter.

There is another problem besides the above case of using the frequency counter in the radio receiver set. That is the problem of drift of the center frequency of the IF Amp. owing to e.g. temperature. By this frequency drift, there is caused an error between the practically received frequency and the displayed frequency. Therefore, conventionally a high speed presettable counter of high cost which can preset the lowest figure is required. Another feature of the present invention is that such an error can be corrected simply. That is, according to the present invention, a double superheterodyne type is used as shown in FIG. 1, and the 2nd Local Osc. 8 has a variable tuning circuit, the frequency variable range of which is nearly equal to the band width of the 2nd IF Amp. By this means, even when an error is caused in the center frequency of the 2nd IF Amp., it can be easily corrected by changing the oscillation frequency of the 2nd Local Osc.

What is claimed is:

1. A radio receiver comprising:
   an input terminal to which a received signal having a frequency band centered about a frequency $f_o$ is applied;
   a variable frequency oscillator for producing a signal having an adjustable frequency $f_v$;
   a first reference oscillator for producing a signal having a fixed frequency $f_{R1}$ which is higher than the upper limit of said frequency band of said received signal;
   a first premixer connected to said variable frequency oscillator and said first reference oscillator for mixing the signals of said variable frequency oscillator and said first reference oscillator;
   a first band pass filter connected to said first premixer for passing a frequency which is the algebraic sum of the frequency of said variable frequency oscillator and the frequency of said first reference oscillator;
   a second reference oscillator for producing a signal having a fixed frequency $f_{R2}$;
   a second premixer connected to said first band pass filter and said second reference oscillator for mixing the signals of said first band pass filter and said second reference oscillator;
   a second band pass filter connected to said second premixer for passing a frequency which is the algebraic sum of the frequency passed by said first band pass filter and the frequency of said second reference oscillator;
   a frequency converter connected to said input terminal and said second band pass filter for mixing the signals of said input terminal and said second band pass filter and producing a signal at an intermediate which is the difference of the frequency of said input terminal and the frequency of said second band pass filter;
   an intermediate frequency amplifier connected to said frequency converter for amplifying the signal of said frequency converter at the intermediate frequency; and wherein:
   said variable frequency oscillator has a variable tuning circuit having a range of frequencies equal to twice the intermediate frequency.

2. A radio receiver which can digitally display a received frequency $f_o$, comprising;
   an input terminal to which a received signal of frequency $f_o$ is applied;
   a first local oscillator for producing a first signal having an adjustable frequency $f_1$ which has a first constant frequency difference from said received signal of frequency $f_o$ and a second signal having an adjustable frequency $f_{v1}$, which has a second constant frequency difference from said received signal of frequency $f_o$;
   a first frequency converter connected to said input terminal and said first local oscillator for mixing the received signal of the input terminal and the first signal of the first local oscillator and producing a signal at an intermediate frequency which is the algebraic sum of the frequency of the received signal of the input terminal and the frequency of said first signal of said first local oscillator;
   a first intermediate frequency amplifier connected to said first local oscillator for amplifying the signal of said first frequency converter at the intermediate frequency;
   a buffer amplifier connected to said first local oscillator for amplifying said second signal of said first local oscillator;
   a gate circuit connected to said buffer amplifier for passing the output signal of said buffer amplifier for a predetermined period;
   a lower digital frequency counter connected to said gate circuit for counting the frequency of the output of said gate circuit and providing a digital output signal thereof;
   an upper digital frequency counter connected to said lower digit counter for counting the upper digits of the frequency of the output of said gate circuit and providing a digital output signal thereof;
   a presetter connected only to said upper digit frequency counter for generating a digital signal representing said second constant frequency difference between the received frequency $f_o$ and the second signal of the first local oscillator frequency $f_{v1}$, and presetting that signal into the upper digit frequency counter for making the digital output signal of said upper digit frequency counter the sum of said preset digital signal and the upper digits of the count of the frequency of the output of said gate circuit; and
   a digital display means connected to said lower digit frequency counter and said upper digit frequency counter for displaying the digital output signals thereof.

3. A radio receiver according to claim 2, wherein said first local oscillator contains:
   a variable frequency oscillator for producing a signal having an adjustable frequency of $f_{v1}$;
   a reference oscillator for producing a signal of fixed frequency equal to the algebraic sum of $f_{v1}$ and $f_1$;
   a frequency conversion means connected to said variable frequency oscillator and said reference oscillator for mixing the signals thereof and for production of a signal of frequency $f_1$.

* * * * *